US012604528B2

(12) United States Patent
    Ishikawa et al.

(10) Patent No.:    US 12,604,528 B2
(45) Date of Patent:        Apr. 14, 2026

(54) DISPLAY DEVICE WITH ION TRAPPING ELECTRODES

(71) Applicant: Magnolia White Corporation, Tokyo (JP)

(72) Inventors: Tomokazu Ishikawa, Tokyo (JP); Masaru Nakakomi, Tokyo (JP); Teppei Yamada, Tokyo (JP); Akihiko Saitoh, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 498 days.

(21) Appl. No.: 18/126,814

(22) Filed: Mar. 27, 2023

(65) Prior Publication Data

US 2023/0317737 A1     Oct. 5, 2023

(30) Foreign Application Priority Data

Mar. 31, 2022    (JP) ................................. 2022-059583

(51) Int. Cl.
    H10D 86/60        (2025.01)
    G02F 1/1362        (2006.01)
    H10D 86/40        (2025.01)
(52) U.S. Cl.
    CPC ....... H10D 86/60 (2025.01); G02F 1/136209 (2013.01); G02F 1/136263 (2021.01); G02F 1/136286 (2013.01); H10D 86/443 (2025.01)
(58) Field of Classification Search
    CPC ........................... H10D 86/443; H10D 86/441
    See application file for complete search history.

(56) References Cited

U.S. PATENT DOCUMENTS

| | | | |
|---|---|---|---|
| 2013/0328051 A1 | 12/2013 | Franklin et al. | |
| 2021/0181568 A1* | 6/2021 | Abe ................. | G02F 1/136218 |
| 2022/0357624 A1 | 11/2022 | Saitoh et al. | |

FOREIGN PATENT DOCUMENTS

| | | | |
|---|---|---|---|
| JP | 2011-002609 A | 1/2011 | |
| JP | 2020038305 A * | 3/2020 | ............... G09F 9/30 |
| JP | 2021-113960 A | 8/2021 | |

OTHER PUBLICATIONS

Translation of JP 2020038305 A (Year: 2018).*
Office Action issued in related Japanese Patent Application No. 2022-059583 issued on Sep. 24, 2025 and English translation of same. 9 pages.

* cited by examiner

*Primary Examiner* — Kretelia Graham
*Assistant Examiner* — Adin Hrnjic
(74) *Attorney, Agent, or Firm* — K&L Gates LLP

(57)        ABSTRACT

A display device includes an array substrate, a first region in which a plurality of scan lines extending in a first direction, a plurality of signal lines extending in a second direction, and a plurality of pixels are provided on the array substrate and that has a first side, a second side, a third side, a fourth side, and a plurality of curved line parts, a second region positioned between an end part of the array substrate and the first region, a signal-line coupling circuit disposed in the second region and coupled to the signal lines, a shield layer disposed in the second region and covering at least part of the signal-line coupling circuit near at least one of the curved line parts, and a gate driver circuit disposed in the second region outside the signal-line coupling circuit and coupled to the scan lines.

7 Claims, 12 Drawing Sheets

DISPLAY DEVICE WITH ION TRAPPING ELECTRODES

CROSS-REFERENCE TO RELATED APPLICATION

This application claims the benefit of priority from Japanese Patent Application No. 2022-059583 filed on Mar. 31, 2022, the entire contents of which are incorporated herein by reference.

BACKGROUND

1. Technical Field

The present disclosure relates to a display device.

2. Description of the Related Art

In a display device according to U.S. Unexamined Patent Application Publication No. 2013/0328051, a display region has a curved surface shape instead of a rectangular shape. The display device according to U.S. Unexamined Patent Application Publication No. 2013/0328051 is also called a free-form display.

Japanese Patent Application Laid-open Publication No. 2021-113960 (JP-A-2021-113960) discloses an ion trapping electrode for keeping ionic impurities out of a display region. JP-A-2021-113960 also discloses a shield layer provided over a drive circuit in a peripheral region.

A display device includes an array substrate and a counter substrate placed over the array substrate, and reference potential is supplied from the array substrate to an end part of the counter substrate through silver paste in some cases. In a severe environment, a compound attributable to the component of the silver paste potentially deposits between an ion trapping electrode and a shield layer and short-circuits the ion trapping electrode and the shield layer.

The present disclosure is intended to provide a display device that can prevent short-circuiting between an ion trapping electrode and a shield layer.

SUMMARY

A display device according to an embodiment of the present disclosure includes an array substrate, a first region in which a plurality of scan lines extending in a first direction, a plurality of signal lines extending in a second direction, and a plurality of pixels are provided on the array substrate and that has a first side, a second side, a third side, a fourth side, and a plurality of curved line parts, a second region positioned between an end part of the array substrate and the first region, a signal-line coupling circuit disposed in the second region and coupled to the signal lines, a shield layer disposed in the second region and covering at least part of the signal-line coupling circuit near at least one of the curved line parts, a gate driver circuit disposed in the second region outside the signal-line coupling circuit and coupled to the scan lines, a first ion trapping electrode disposed between the shield layer and the gate driver circuit, provided in a linear shape along the gate driver circuit, and supplied with constant potential, a second ion trapping electrode disposed between the shield layer and the first ion trapping electrode, provided in a linear shape along an edge of the shield layer, and supplied with the same potential as the first ion trapping electrode, and a bifurcating electrode through which the second ion trapping electrode bifurcates from halfway through the first ion trapping electrode in the linear shape.

BRIEF DESCRIPTION OF THE DRAWINGS

FIG. 3 is a sectional view illustrating a region A in FIG. 2A in an enlarged manner;

FIG. 12 is a XII-XII' sectional view of FIG. 11; and

DETAILED DESCRIPTION

Aspects (embodiments) of the present disclosure will be described below in detail with reference to the accompanying drawings. Contents described below in the embodiments do not limit the present disclosure. Components described below include those that could be easily thought of by the skilled person in the art and those identical in effect. Components described below may be combined as appropriate. The disclosure is merely exemplary, and any modification that could be easily thought of by the skilled person in the art as appropriate without departing from the gist of the disclosure is contained in the scope of the present disclosure. For clearer description, the drawings are schematically illustrated for the width, thickness, shape, and the like of each component as compared to an actual aspect in some cases, but the drawings are merely exemplary and do not limit interpretation of the present disclosure. In the present specification and drawings, any element same as that already described with reference to an already described drawing is denoted by the same reference sign, and detailed description thereof is omitted as appropriate in some cases.

Embodiment

Figure 1:
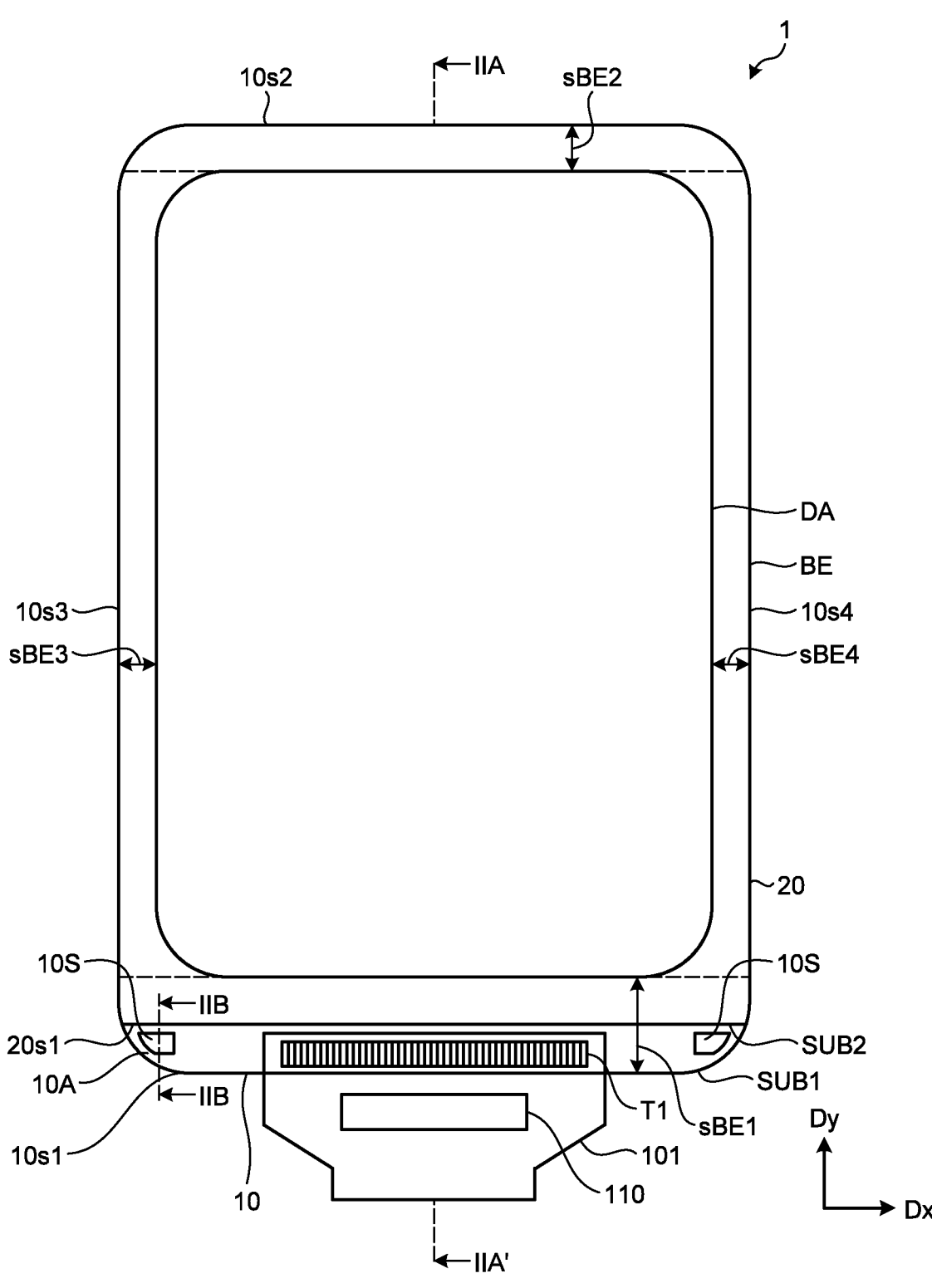
FIG. 1 is a plan view schematically illustrating a display device according to an embodiment.
Figure 2A:
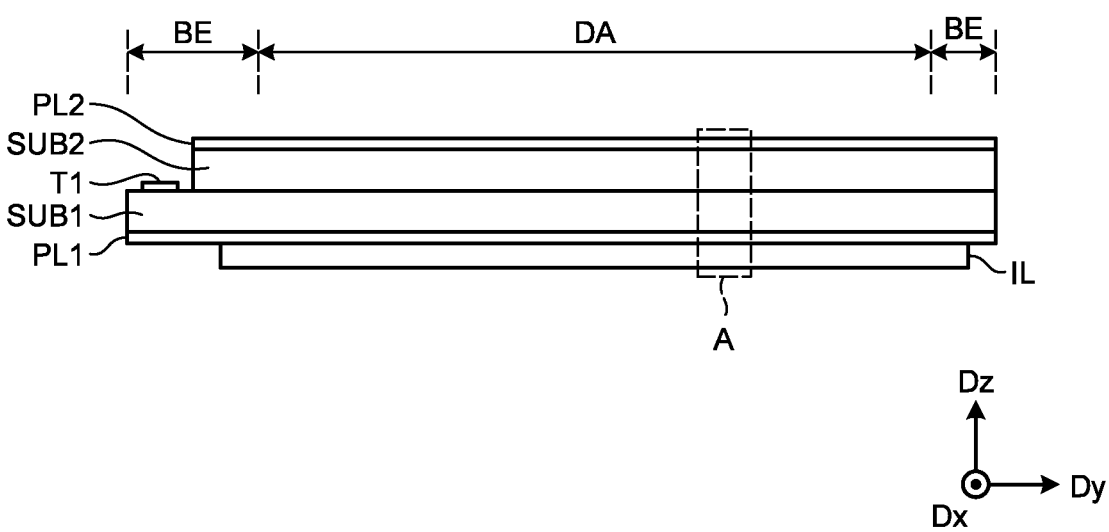
FIG. 2A is a IIA-IIA' sectional view of FIG. 1.
Figure 2B:
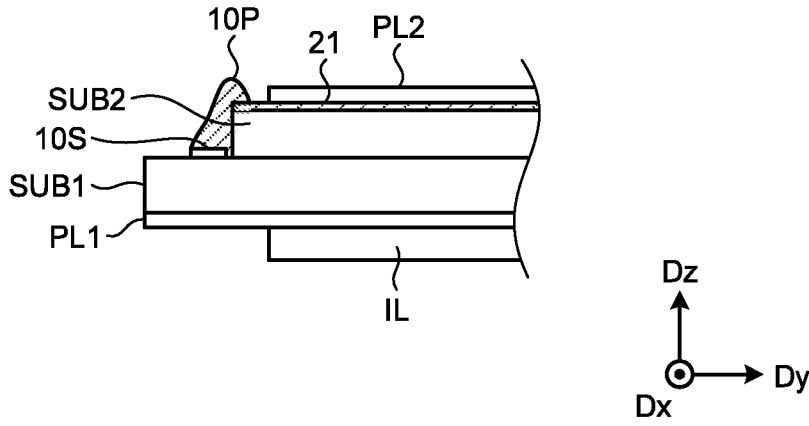
FIG. 2B is a IIB-IIB' sectional view of FIG. 1.
Figure 3:
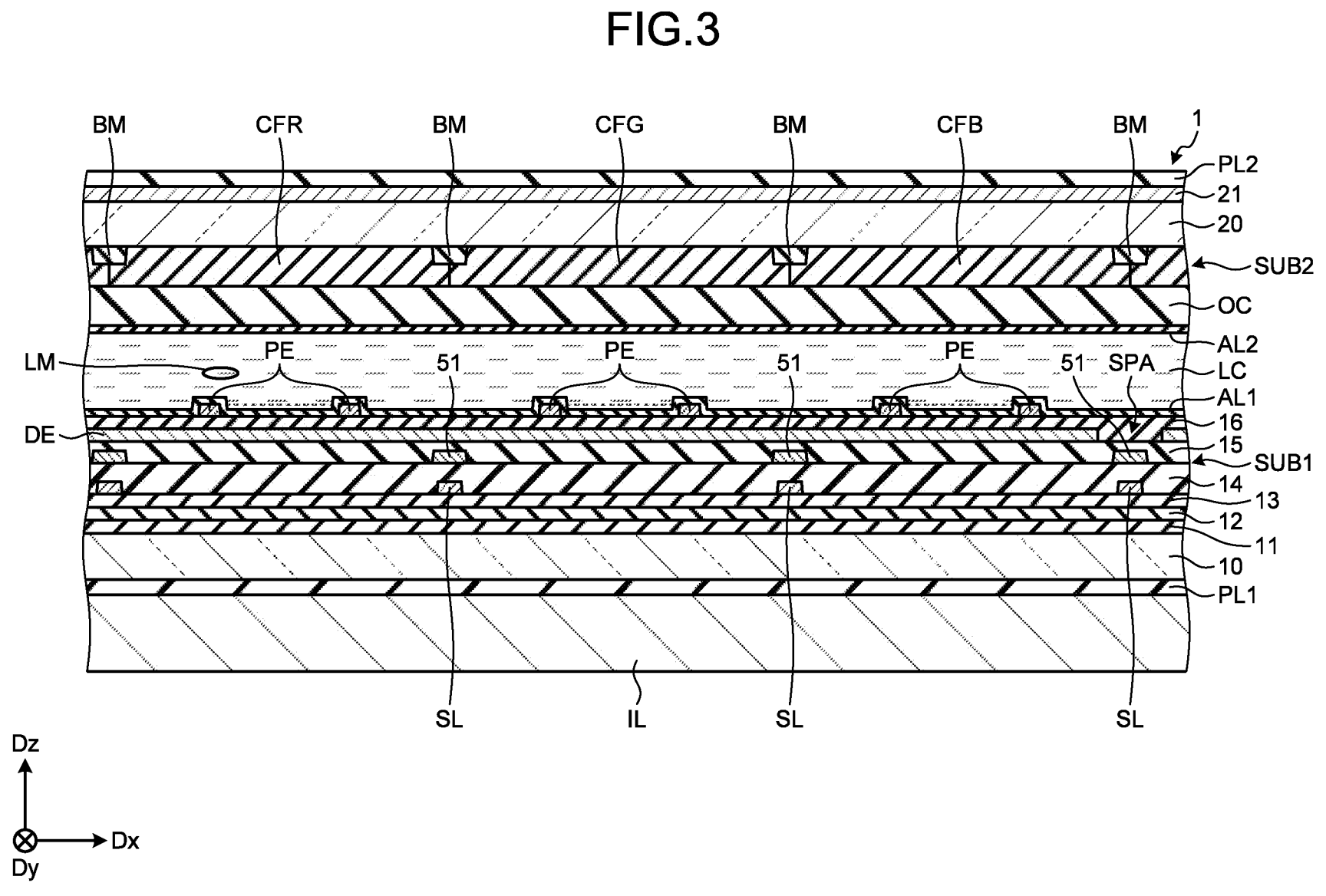

FIG. 1 is a plan view schematically illustrating a display device according to the embodiment. FIG. 2A is a IIA-IIA' sectional view of FIG. 1. FIG. 2B is a IIB-IIB' sectional view of FIG. 1. FIG. 3 is a sectional view illustrating a region A in FIG. 2A in an enlarged manner. As illustrated in FIG. 1, a display device 1 includes an array substrate SUB1 and a counter substrate SUB2. In the display device 1, a peripheral region BE (second region) is provided outside a display region DA (first region). The display device 1 is formed in a substantially rectangular shape in which corner parts of the display region DA have curved line shapes, but the outer shape of the display region DA is not particularly limited. For example, the display region DA may include a cutout, may be formed in another polygonal shape, or may be formed in another shape such as a circular shape or an elliptical shape.

In the present embodiment, a first direction Dx is a direction along the short sides of the display region DA. A second direction Dy is a direction intersecting (or orthogonal to) the first direction Dx. The present invention is not limited thereto, and the second direction Dy may intersect the first direction Dx at an angle other than 90°. A plane defined by the first direction Dx and the second direction Dy is parallel to the surface of the array substrate SUB1. A third direction Dz orthogonal to the first direction Dx and the second direction Dy is the thickness direction of the array substrate SUB1.

The display region DA is a region in which an image is to be displayed, and is a region overlapping a plurality of pixels PX. The peripheral region BE indicates a region inside the outer periphery of the array substrate SUB1 and outside the display region DA. The peripheral region BE may have a frame shape enclosing the display region DA, and in this case, the peripheral region BE may be regarded as a frame region.

A first insulation substrate 10 included in the array substrate SUB1 has a first side 10s1, a second side 10s2, a third side 10s3, and a fourth side 10s4. The first side 10s1 extends in the first direction Dx in a plan view. The second side 10s2 faces the first side 10s1. The third side 10s3 extends in the second direction Dy. The fourth side 10s4 faces the third side 10s3.

The peripheral region BE includes a first partial peripheral region sBE1, a second partial peripheral region sBE2, a third partial peripheral region sBE3, and a fourth partial peripheral region sBE4. In the present embodiment, the first partial peripheral region sBE1 is a region between the first side 10s1 and an extended virtual line (illustrated with a dashed and double-dotted line) of a straight portion of one short side of the display region DA. The second partial peripheral region sBE2 is a region between the second side 10s2 and an extended virtual line of a straight portion of the other short side of the display region DA. Each of the third partial peripheral region sBE3 and the fourth partial peripheral region sBE4 is a region between the first partial peripheral region sBE1 and the second partial peripheral region sBE2 and is provided along the corresponding one of the third side 10s3 and the fourth side 10s4.

As illustrated in FIGS. 1 and 2A, the length of the array substrate SUB1 in the second direction Dy is longer than the length of the counter substrate SUB2 in the second direction Dy. As illustrated in FIG. 1, the first insulation substrate 10 includes a protrusion part 10A. The protrusion part 10A protrudes outside a first side 20s1 of a second insulation substrate 20 in a plan view.

A plurality of terminals T1 are provided at the protrusion part 10A. The terminals T1 are arrayed in the first direction Dx along the first side 10s1 in the first partial peripheral region sBE1. A wiring substrate 101 is provided at the protrusion part 10A. The wiring substrate 101 is constituted by, for example, flexible printed circuits (FPC). The wiring substrate 101 is coupled to the terminals T1 of the first insulation substrate 10 by, for example, Film On Glass (FOG) using an anisotropic conductive film (ACF) (hereinafter referred to as "FOG mounting"). Accordingly, wires of the first insulation substrate 10 are electrically coupled to respective wires of the wiring substrate 101.

A driver integrated circuit (IC) 110 is provided on the wiring substrate 101. The driver IC 110 includes a control circuit configured to control display on the display device 1, a detection circuit, an analog front end, and the like. The driver IC 110 is mounted on the wiring substrate 101 by, for example, Chip On Film (COF) using an ACF (hereinafter referred to as "COF mounting"). However, the present invention is not limited to this example, and the driver IC 110 may be mounted on the first insulation substrate 10 by Chip On Glass (COG). In this case, the driver IC 110 is provided between the terminals T1 to which the wiring substrate 101 is coupled and a signal-line coupling circuit 30 (refer to FIG. 5). The driver IC 110 is not limited to this disposition but may be provided on, for example, a control board or a flexible substrate outside the module.

As illustrated in FIGS. 2A and 3, the counter substrate SUB2 is oppositely disposed in a direction perpendicular to the surface of the array substrate SUB1. A liquid crystal layer LC is provided between the array substrate SUB1 and the counter substrate SUB2.

As illustrated in FIG. 1, a pad electrode 10S that has reference potential is provided beside the terminal T1 at the protrusion part 10A of the array substrate SUB1. As illustrated in FIG. 2B, a conductive pillar 10p of silver paste is stacked on the pad electrode 10S and provided along the first side 20s1 of the second insulation substrate 20, and part of the silver paste is mounted on the second insulation substrate 20. The conductive pillar 10P is electrically coupled to a conductive layer 21 to be described later.

In FIG. 3, the array substrate SUB1 is provided on the first insulation substrate 10, which is translucent, such as a glass substrate or a resin substrate, as a base. The array substrate SUB1 includes a first insulating film 11, a second insulating film 12, a third insulating film 13, a fourth insulating film 14, a fifth insulating film 15, a sixth insulating film 16, signal lines SL, pixel electrodes PE, detection electrodes DE, and a first alignment film AL1 on a side of the first insulation substrate 10, the side facing the counter substrate SUB2.

In the present specification, in a direction perpendicular to the first insulation substrate 10, a direction from the first insulation substrate 10 toward the second insulation substrate 20 is referred to as an "upward" direction or simply an "up" direction. In addition, a direction from the second insulation substrate 20 toward the first insulation substrate 10 is referred to as a "downward" direction or simply a "down" direction. A "plan view" is a view in the direction perpendicular to the first insulation substrate 10. The detection electrodes DE are also referred to as first electrodes, and the pixel electrodes PE are also referred to as second electrodes.

The first insulating film 11 is positioned on the first insulation substrate 10. The second insulating film 12 is positioned on the first insulating film 11. The third insulating film 13 is positioned on the second insulating film 12. The signal lines SL are positioned on the third insulating film 13. The fourth insulating film 14 is positioned on the third insulating film 13 and covers the signal lines SL.

Sensor wires 51 are positioned on the fourth insulating film 14. The sensor wires 51 face the signal lines SL with the fourth insulating film 14 interposed therebetween. Accordingly, the sensor wires 51 are superimposed on the signal lines SL. The sensor wires 51 are covered by the fifth insulating film 15. The first insulating film 11, the second insulating film 12, the third insulating film 13, and the sixth insulating film 16 are formed of a translucent inorganic material such as silicon oxide or silicon nitride. The fourth insulating film 14 and the fifth insulating film 15 are formed of a translucent resin material and have film thicknesses thicker than those of the other insulating films formed of the inorganic material. In other words, the signal lines SL are covered by the fourth insulating film 14 and the fifth insulating film 15 serving as organic insulating films. Note that the fifth insulating film 15 may be formed of an inorganic material.

The detection electrodes DE are positioned on the fifth insulating film 15. The detection electrodes DE face the sensor wires 51 with the fifth insulating film 15 interposed therebetween. Slits SPA of the detection electrodes DE are positioned directly above the sensor wires 51. The detection electrodes DE are covered by the sixth insulating film 16.

The pixel electrodes PE are positioned on the sixth insulating film 16 and face the detection electrodes DE with the sixth insulating film 16 interposed therebetween. The pixel electrodes PE and the detection electrodes DE are formed of a translucent conductive material such as indium tin oxide (ITO) or indium zinc oxide (IZO). The pixel electrodes PE are covered by the first alignment film AL1. The first alignment film AL1 also covers the sixth insulating film 16.

The counter substrate SUB2 is provided on the second insulation substrate 20, which is translucent, such as a glass substrate or a resin substrate, as a base. The counter substrate SUB2 includes a light-shielding layer BM, color filters CFR, CFG, and CFB, an overcoat layer OC, and a second alignment film AL2 on a side of the second insulation substrate 20, the side facing the array substrate SUB1. The counter substrate SUB2 includes a conductive layer 21 on a side of the second insulation substrate 20, the side being opposite the array substrate SUB1.

The light-shielding layer BM is positioned on the side of the second insulation substrate 20 facing the array substrate SUB1. The light-shielding layer BM defines opening parts facing the respective pixel electrodes PE. The pixel electrodes PE are partitioned by the opening parts for pixels. The light-shielding layer BM is formed of a black resin material or a light-shielding metallic material.

Each of the color filters CFR, CFG, and CFB is positioned on the side of the second insulation substrate 20 facing the array substrate SUB1, and has end parts overlapping the light-shielding layer BM. For example, the color filters CFR, CFG, and CFB are formed of resin materials colored in red, green, and blue, respectively.

The overcoat layer OC covers the color filters CFR, CFG, and CFB. The overcoat layer OC is formed of a translucent resin material. The second alignment film AL2 covers the overcoat layer OC. The first alignment film AL1 and the second alignment film AL2 are formed of, for example, a material having horizontal orientation.

The array substrate SUB1 and the counter substrate SUB2 are disposed such that the first alignment film AL1 and the second alignment film AL2 face each other. The liquid crystal layer LC is encapsulated between the first alignment film AL1 and the second alignment film AL2. The liquid crystal layer LC is made of a negative liquid crystal material having negative dielectric constant anisotropy, or a positive liquid crystal material having positive dielectric constant anisotropy.

The array substrate SUB1 faces a backlight unit IL, and the counter substrate SUB2 is positioned on a display surface side. The backlight unit IL may be provided in various forms, but description of a detailed structure thereof is omitted.

The conductive layer 21 is provided on the second insulation substrate 20. The conductive layer 21 is a translucent conductive material such as ITO. The conductive layer 21 is electrically coupled to a pad electrode 10S through the conductive pillar 10P (refer to FIG. 2B). Accordingly, static electricity applied from the outside and static electricity charged on a polarization plate PL2 flow through the conductive layer 21. The display device 1 can remove static electricity in a short time and reduce the amount of static electricity applied to the liquid crystal layer LC serving as a display layer. Accordingly, the display device 1 can have improved ESD resistance. The conductive layer 21 is particularly useful in a display device using a horizontal electric field formed between each pixel electrode PE and each common electrode (detection electrode DE) provided in the array substrate SUB1.

An optical element including a polarization plate PL1 is disposed on the outer surface of the first insulation substrate 10 or a surface thereof facing the backlight unit IL. An optical element including the polarization plate PL2 is disposed on the outer surface of the second insulation substrate 20 or a surface thereof on an observation position side. A first polarization axis of the polarization plate PL1 and a second polarization axis of the polarization plate PL2 have, for example, a cross Nicol positional relation on an X-Y plane. The polarization plate PL2 and the optical element including the polarization plate PL2 may include any other optical function element such as a wave plate.

For example, when the liquid crystal layer LC is made of a negative liquid crystal material, the long axis of each liquid crystal molecule LM is initially oriented in the first direction Dx in an X-Y plane with no voltage applied to the liquid crystal layer LC. However, with voltage applied to the liquid crystal layer LC, in other words, in an on-state in which an electric field is formed between the pixel electrodes PE and the detection electrodes DE, the orientation state of the liquid crystal molecule LM changes due to influence of the electric field. In the on-state, the polarization state of incident linearly polarized light changes in accordance with the orientation state of the liquid crystal molecule LM as the light passes through the liquid crystal layer LC.

Figure 4:
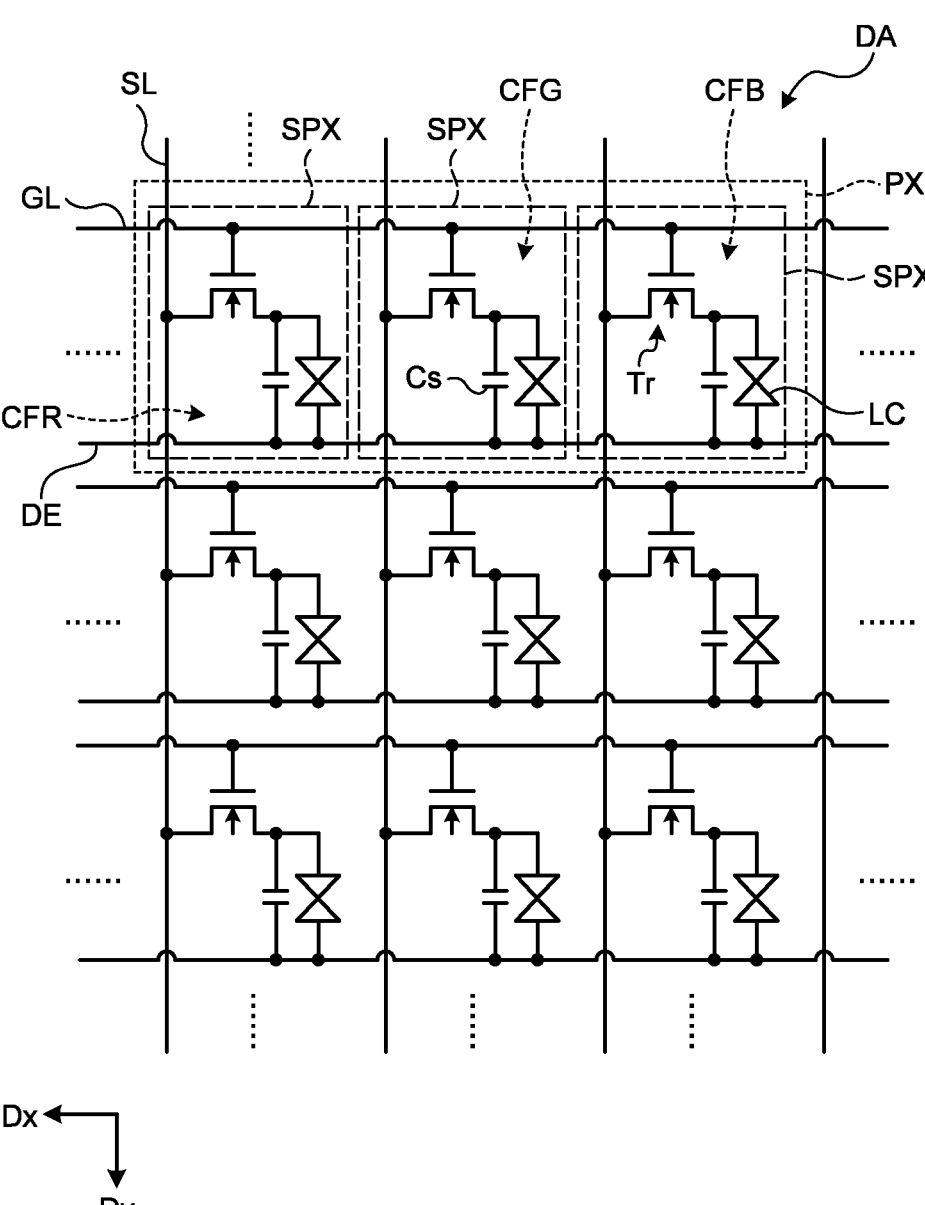
FIG. 4 is a circuit diagram illustrating a pixel array in a display region.

FIG. 4 is a circuit diagram illustrating a pixel array in the display region. For example, switching elements Tr of respective sub pixels SPX illustrated in FIG. 4, the signal lines SL, and scan lines GL are formed in the array substrate SUB1. In the display region DA, the signal lines SL extend in the second direction Dy. The signal lines SL are wires for supplying pixel signals to the pixel electrodes PE (refer to FIG. 3). In the display region DA, the scan lines GL extend in the first direction Dx. The scan lines GL are wires for supplying gate signals (scanning signals) that drive the switching elements Tr.

Each pixel PX includes a plurality of sub pixels SPX. Each sub pixel SPX includes a switching element Tr and a capacitor of the liquid crystal layer LC. The switching element Tr is constituted by a thin film transistor, and in this example, is constituted by an n-channel metal-oxide-semiconductor (MOS) TFT. The sixth insulating film 16 is provided between the pixel electrodes PE and the detection electrodes DE illustrated in FIG. 3, and a holding capacitor Cs illustrated in FIG. 4 is formed by these components.

The color filters CFR, CFG, and CFB illustrated in FIG. 3 are provided as a periodic array of color regions colored in, for example, three colors of red (R), green (G), and blue (B). Each set of color regions in the three colors of R, G, and B are associated with respective sub pixels SPX. Each set of sub pixels SPX corresponding to color regions in the three colors constitute a pixel PX. The color filters may include color regions in four or more colors. In this case, each pixel PX may include four sub pixels SPX or more.

Figure 5:
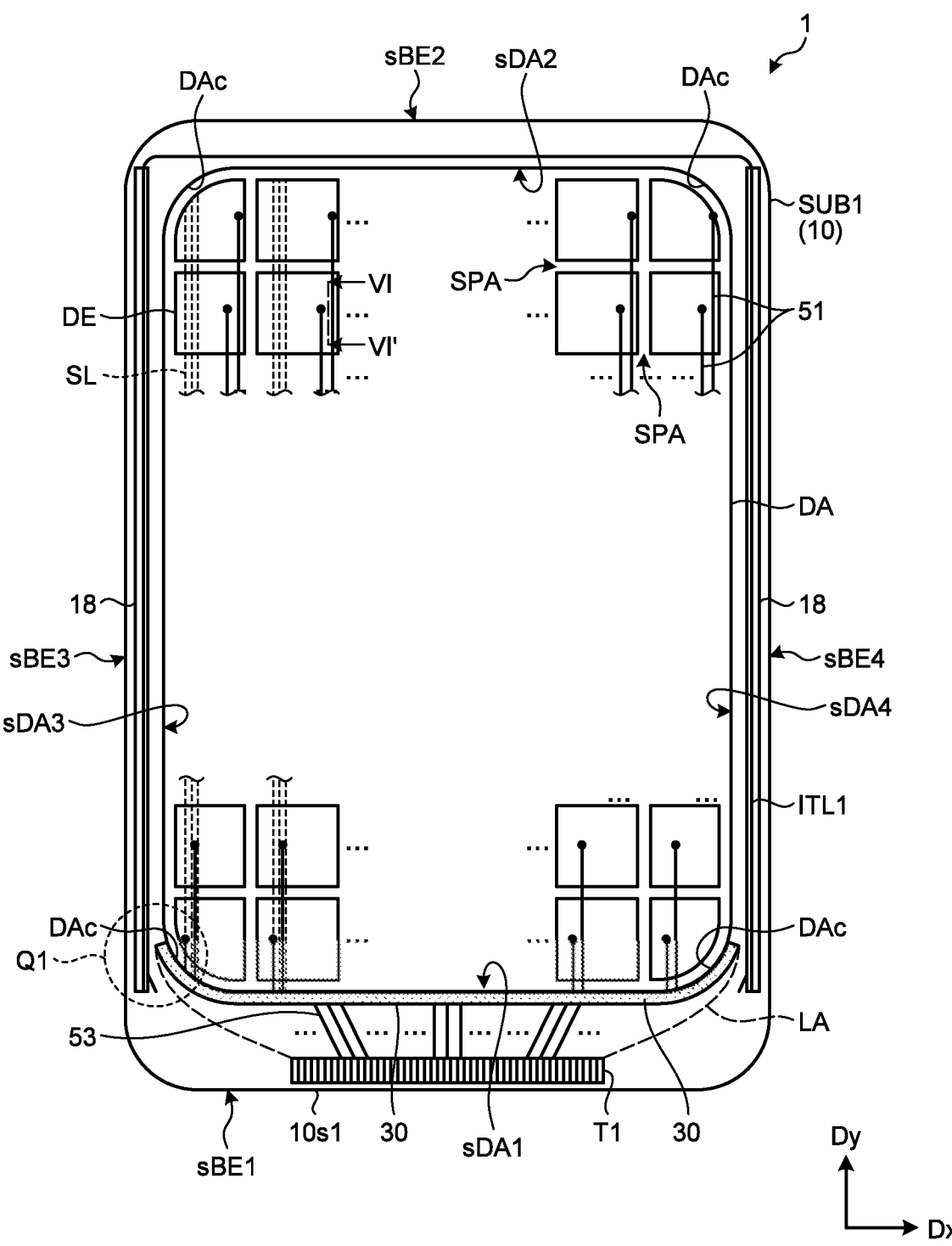
FIG. 5 is a plan view schematically illustrating an array substrate according to the embodiment.
Figure 6:
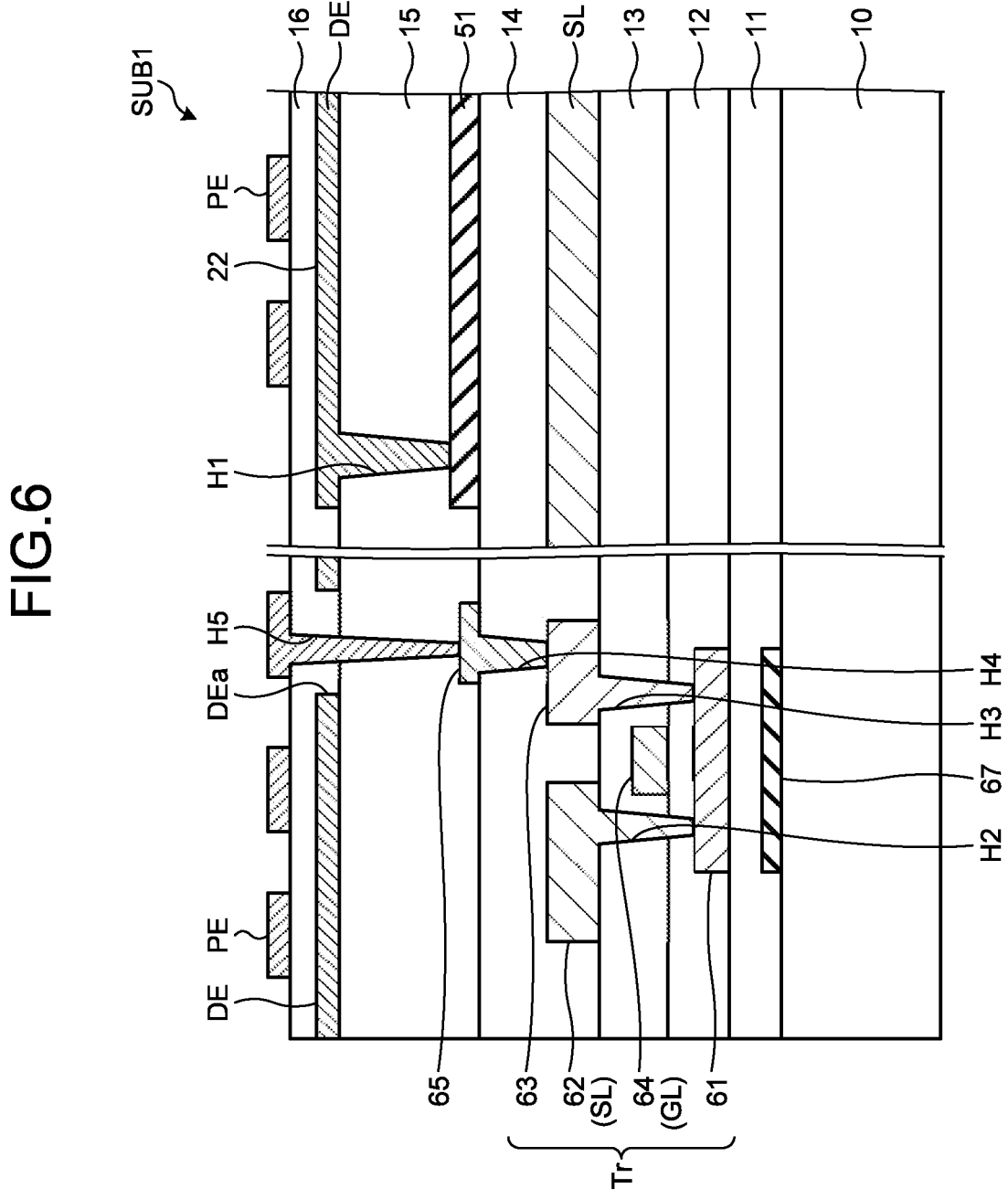
FIG. 6 is a VI-VI' sectional view of FIG. 5.

FIG. 5 is a plan view schematically illustrating the array substrate. FIG. 6 is a VI-VI' sectional view of FIG. 5. FIG. 6 also schematically illustrates a multilayered structure of the switching element Tr of each sub pixel SPX. The display region DA in which an image is displayed includes a sensor region included in a detection device configured to detect capacitance. As illustrated in FIG. 5, the detection electrodes DE are arrayed in a matrix with a row-column configuration in the first direction Dx and the second direction Dy in the display region DA. The detection electrodes DE are partitioned in the first direction Dx and the second direction Dy by the slits SPA. Each detection electrode DE is schematically illustrated in a rectangular shape or a square shape in a plan view, but not limited thereto and may have a polygonal shape, a parallelogram shape, or an odd shape including a cutout or the like. The detection electrodes DE are made of, for example, a translucent conductive material such as ITO.

The display device 1 further includes the signal-line coupling circuit 30, a wiring region LA including a plurality of wires 53, and gate driver circuits 18. The signal-line coupling circuit 30 includes a plurality of analog switch elements and is also called a multiplexer. The signal-line coupling circuit 30 and the wiring region LA are provided in the first partial peripheral region sBE1 of the first insulation substrate 10. The terminals T1, the wiring region LA (wires 53), the signal-line coupling circuit 30, and the signal lines SL are coupled in the stated order from the first side 10s1 toward the display region DA. The two gate driver circuits 18 are provided in the third partial peripheral region sBE3 and the fourth partial peripheral region sBE4, respectively. In other words, the two gate driver circuits 18 are disposed along a third side sDA3 and a fourth side sDA4, respectively, of the display region DA. The gate driver circuits 18 are disposed outside the signal-line coupling circuit 30. Only one gate driver circuit 18 may be provided in any one of the third partial peripheral region sBE3 and the fourth partial peripheral region sBE4.

The sensor wires 51 are electrically coupled to the respective detection electrodes DE and extended to the peripheral region BE. The sensor wires 51 extend in the second direction Dy and are disposed alongside in the first direction Dx. Each sensor wire 51 has one end side coupled to the corresponding detection electrode DE and the other end side electrically coupled to the signal-line coupling circuit 30. The other end side of each sensor wire 51 is coupled to the corresponding terminal T1 through the corresponding wire 53. In this manner, the detection electrodes DE are electrically coupled to the driver IC 110 (refer to FIG. 1).

At display, the driver IC 110 supplies a display drive signal to each sensor wire 51 through the corresponding wire 53. Each detection electrode DE is supplied with the display drive signal at display and functions as a common electrode for a plurality of pixel electrodes PE. During display, all detection electrodes DE have a common potential. At touch detection, the driver IC 110 supplies a touch drive signal for detection to each detection electrode DE through the corresponding sensor wire 51. Accordingly, a detection signal in accordance with capacitance change of the detection electrode DE is supplied to the detection circuit of the driver IC 110 through the wire 53. In this manner, the display device 1 can detect a detection target body in a contact state or a proximity state at each detection electrode DE.

The pixel electrodes PE (refer to FIG. 3) are electrically coupled to the driver IC 110 through the signal lines SL and the signal-line coupling circuit 30. The signal lines SL are electrically coupled to the respective pixel electrodes PE arranged in the first direction Dx and are extended to the peripheral region BE. The signal lines SL extend in the second direction Dy and are disposed alongside in the first direction Dx. FIG. 5 illustrates only some of the signal lines SL and the sensor wires 51 for simplification of the drawing.

As illustrated in FIG. 5, the display region DA is a rectangle including a first side sDA1, a second side sDA2, the third side sDA3, and the fourth side sDA4. The first side sDA1, the second side sDA2, the third side sDA3, and the fourth side sDA4 are continuously coupled to each other through a curved line part DAc. The third side sDA3 faces the fourth side sDA4, and the second side sDA2 faces the first side sDA1.

An ion trapping electrode ITL1 is disposed in the second partial peripheral region sBE2, the third partial peripheral region sBE3, and the fourth partial peripheral region sBE4 along the second side sDA2, the third side sDA3, and the fourth side sDA4. The ion trapping electrodes ITL1 continuously extend along the second side sDA2, the third side sDA3, and the fourth side sDA4. Accordingly, the display region DA is positioned on the inner side of the ion trapping electrode ITL1.

The ion trapping electrode ITL1 in the third partial peripheral region sBE3 is disposed between one of the gate driver circuits 18 and the third side sDA3. The ion trapping electrode ITL1 in the fourth partial peripheral region sBE4 is disposed between the other gate driver circuit 18 and the fourth side sDA4.

The signal-line coupling circuit 30 is provided along the boundary between the display region DA and the first partial peripheral region sBE1 and provided along the curved line parts DAc in the display region DA. An end part of each gate driver circuit 18 on the first partial peripheral region sBE1 side is provided alongside the corresponding curved line part DAc in the first direction Dx. Part of the signal-line coupling circuit 30 along each curved line part DAc is provided between the corresponding gate driver circuit 18 and the corresponding curved line part DAc in the first direction Dx. The signal lines SL are coupled to the signal-line coupling circuit 30. The signal-line coupling circuit 30 is then electrically coupled to the wiring substrate 101 (refer to FIG. 1) through the wires 53 and the terminals T1 provided in the wiring region LA. The signal-line coupling circuit 30 switches coupling and decoupling between each signal line SL and the corresponding wire 53.

The liquid crystal layer LC is encapsulated between the array substrate SUB1 and the counter substrate SUB2, normally, by sealing. When impurities such as metallic ions, inorganic anions, or organic acid enter the liquid crystal layer LC in the display region DA from the outside, an appropriate electric field cannot be maintained due to the impurities, which potentially causes display defects such as display speckle and burn-in. Constant potential is supplied to the ion trapping electrode ITL1 to prevent such a display defect. The constant potential is fixed to, for example, a VGL potential at low voltage among signals (voltages) used as control signals. Accordingly, the ion trapping electrode ITL1 keeps ionic impurities in the peripheral region BE and prevents them from entering the liquid crystal layer LC in the display region DA.

In a region Q1 in FIG. 5, which is adjacent to a curved line part DAc, the ion trapping electrode ITL1 is disposed between the corresponding gate driver circuit 18 and the wires 53 provided in the wiring region LA. Accordingly, the ion trapping electrode ITL1 can prevent ionic impurities gathering near the curved line part DAc from entering the liquid crystal layer LC in the display region DA.

As illustrated in FIG. 6, each switching element Tr includes a semiconductor 61, a source electrode 62, a drain electrode 63, and a gate electrode 64. The semiconductor 61 is provided on the first insulation substrate 10 with the first insulating film 11 interposed therebetween. A light-shielding layer 67 is provided between the first insulation substrate 10 and the semiconductor 61 in the direction perpendicular to the first insulation substrate 10.

The second insulating film 12 is provided on the first insulating film 11 and covers the semiconductor 61. The gate electrode 64 is provided on the second insulating film 12. The gate electrode 64 is part of the corresponding scan line GL, the part overlapping the semiconductor 61. The third insulating film 13 is provided on the second insulating film 12 and covers the semiconductor 61 and the gate electrode 64. A channel region is formed at part of the semiconductor 61, the part overlapping the gate electrode 64.

In the example illustrated in FIG. 6, the switching element Tr has what is called a top gate structure. However, the switching element Tr may have a bottom gate structure in which the gate electrode 64 is provided below the semiconductor 61. Alternatively, the switching element Tr may have a dual gate structure in which the gate electrodes 64 are provided on both sides of the semiconductor 61 in the direction perpendicular to the first insulation substrate 10.

The source electrode 62 and the drain electrode 63 are provided on the third insulating film 13. In the present embodiment, the source electrode 62 is electrically coupled to the semiconductor 61 through a contact hole H2. The drain electrode 63 is electrically coupled to the semiconductor 61 through a contact hole H3. The source electrode 62 is part of the signal line SL, the part overlapping the semiconductor 61.

The fourth insulating film 14 and the fifth insulating film 15 are provided on the third insulating film 13 and cover the source electrode 62 and the drain electrode 63. A relay electrode 65 and the corresponding sensor wire 51 are provided on the fourth insulating film 14. The relay electrode 65 is electrically coupled to the drain electrode 63 through a contact hole H4. The sensor wire 51 is provided above the signal line SL. The sensor wire 51 is superimposed on the signal line SL in a plan view and extends in parallel to the signal line SL. The corresponding detection electrode DE is provided on the fifth insulating film 15. The detection electrode DE is electrically coupled to the sensor wire 51 through a contact hole H1.

The corresponding pixel electrode PE is electrically coupled to the relay electrode 65 through a contact hole H5 provided in the sixth insulating film 16 and the fifth insulating film 15. The contact hole H5 is formed at a position overlapping an opening DEa of the detection electrode DE. With such a configuration, the pixel electrode PE is coupled to the switching element Tr.

As described above, the scan lines GL, the signal lines SL, the sensor wires 51, the detection electrodes DE (first electrodes), and the pixel electrodes PE (second electrodes) are sequentially layered in the display region DA with an insulating film interposed between layers.

Figure 7:
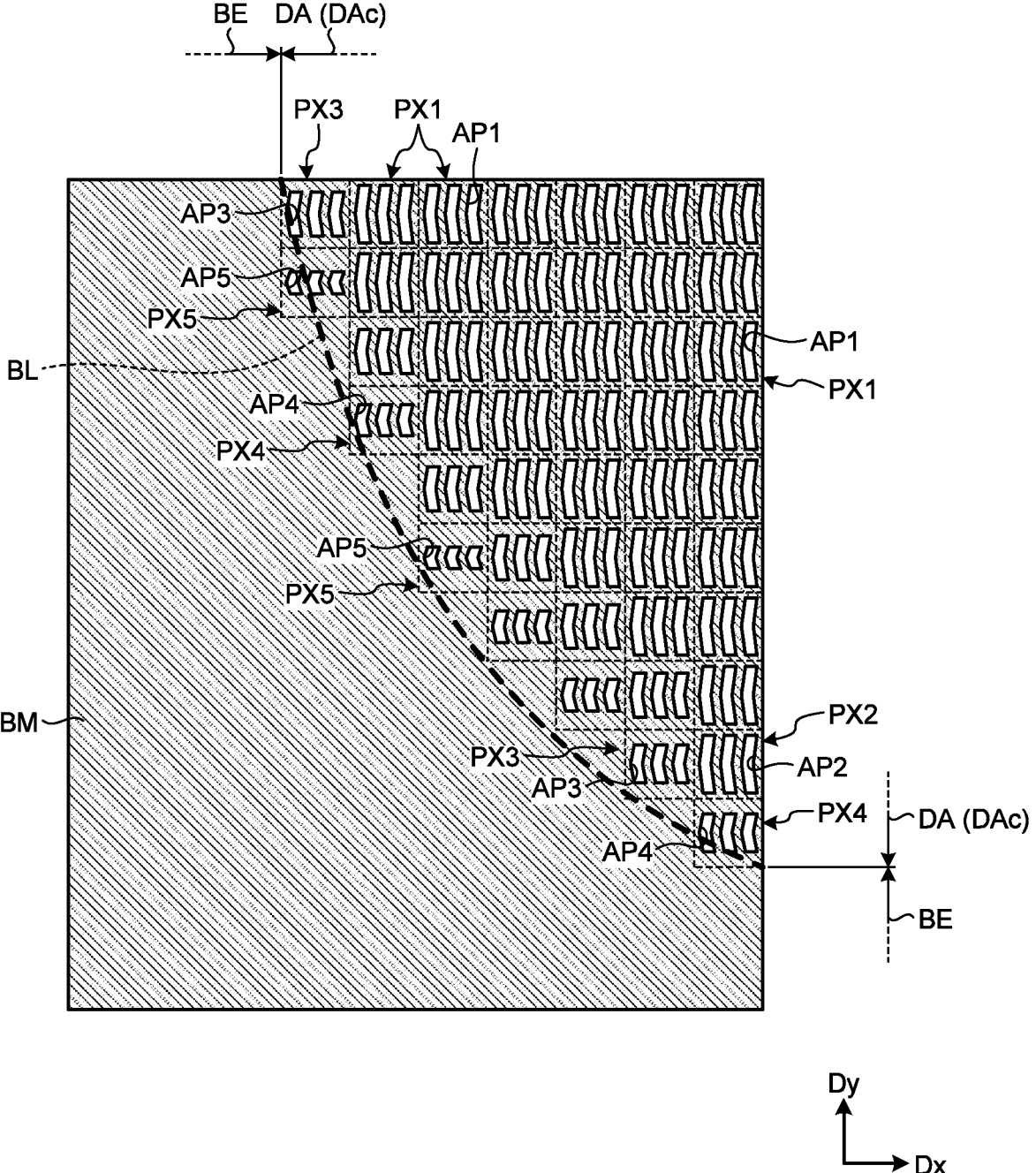
FIG. 7 is a plan view illustrating an exemplary light-shielding layer according to the embodiment.

FIG. 7 is a plan view illustrating an exemplary light-shielding layer according to the embodiment. In the present embodiment, a boundary BL of each curved line part DAc between the display region DA and the peripheral region BE is formed by differentiating the aperture ratio per unit area of the light-shielding layer BM.

For example, the display region DA includes a first pixel PX1, a second pixel PX2, a third pixel PX3, a fourth pixel PX4, and a fifth pixel PX5 among the pixels PX. The aperture ratio per unit area of the light-shielding layer BM is different among the first pixel PX1, the second pixel PX2, the third pixel PX3, the fourth pixel PX4, and the fifth pixel PX5.

The light-shielding layer BM at a position overlapping the first pixel PX1 includes three first opening parts AP1. The light-shielding layer BM at a position overlapping the second pixel PX2 includes three second opening parts AP2. The light-shielding layer BM at a position overlapping the third pixel PX3 includes three third opening parts AP3. The light-shielding layer BM at a position overlapping the fourth pixel PX4 includes three fourth opening parts AP4. The light-shielding layer BM at a position overlapping the fifth pixel PX5 includes three fifth opening parts AP5.

The area (aperture ratio) of each opening part decreases in the order of the first opening parts AP1, the second opening parts AP2, the third opening parts AP3, the fourth opening parts AP4, and the fifth opening parts AP5. The opening area of each first opening part AP1 is largest, and the opening area of the fifth opening part AP5 is smallest. Accordingly, light transmittance decreases in the order of the first pixel PX1, the second pixel PX2, the third pixel PX3, the fourth pixel PX4, and the fifth pixel PX5.

In the present embodiment, the first opening parts AP1, the second opening parts AP2, the third opening parts AP3, the fourth opening parts AP4, and the fifth opening parts AP5 are disposed such that light transmittance decreases as the positions moves from the display region DA to the peripheral region BE in the first direction Dx and the second direction Dy. In this manner, the light-shielding layer BM defines the boundary BL of each curved line part DAc.

Figure 8:
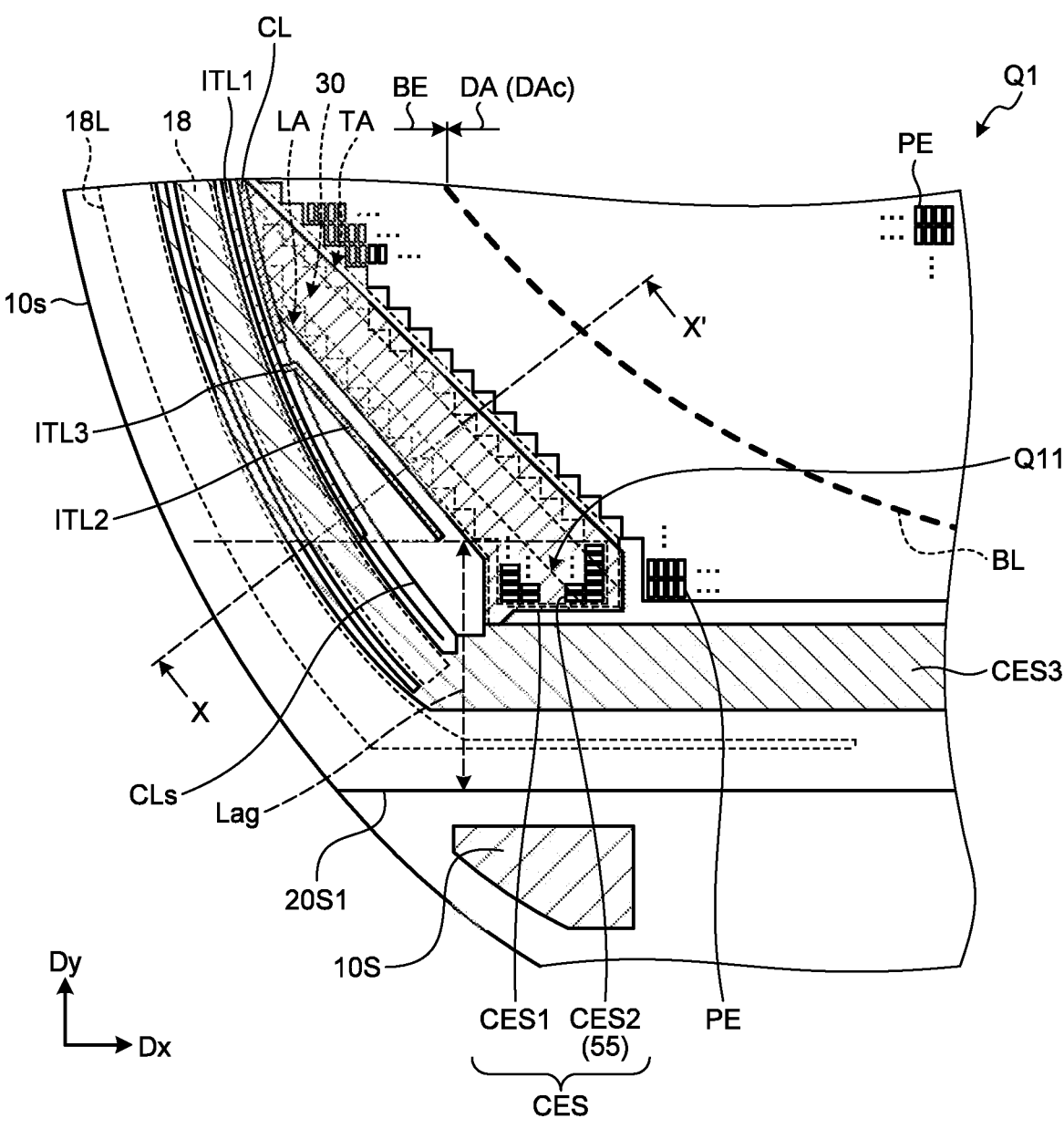
FIG. 8 is a plan view illustrating a shield layer and an ion trapping electrode according to the embodiment disposed adjacent to the display region at a curved-line-shaped corner part.

The following describes the configurations of a shield layer CES and ion trapping electrodes ITL1 and ITL2 according to the present embodiment in detail. FIG. 8 is a plan view illustrating the shield layer and the ion trapping electrodes according to the embodiment disposed adjacent to the display region at a curved-line-shaped corner part. Although illustrated in FIG. 5, a wiring region TA including a plurality of signal lines SL and a plurality of sensor wires 51 (refer to FIG. 5) is provided outside the boundary BL of the curved line part DAc in the region Q1 as illustrated in FIG. 8.

A disposition region of the signal-line coupling circuit 30 is provided outside the wiring region TA. The wiring region LA is provided outside the disposition region of the signal-line coupling circuit 30. In the present embodiment, a plurality of pixel electrodes PE (pixels PX) are provided between the boundary BL and the wiring region TA. Accordingly, wires and peripheral circuits in the peripheral region BE can be prevented from being visually recognized when viewed by a viewer in an oblique direction.

The shield layer CES is provided near the curved line part DAc. The shield layer CES includes a first shield layer CES1 and a second shield layer CES2. The first shield layer CES1 covers at least part of the signal-line coupling circuit 30, the wiring region TA, and the wiring region LA. The second shield layer CES2 is disposed overlapping the first shield layer CES1. The second shield layer CES2 includes a plurality of shield parts 55 formed in a rectangular shape having an area smaller than that of the first shield layer CES1, and the shield parts 55 are arrayed in the first direction Dx and the second direction Dy. The width of the first shield layer CES1 in the first direction Dx decreases as the distance between the gate driver circuit 18 and the boundary BL decreases. The width of the second shield layer CES2 (the number of shield parts 55) changes in accordance with the width of the first shield layer CES1 in the first direction Dx.

The first shield layer CES1 and the second shield layer CES2 are coupled to a coupling wire CL that supplies reference potentials having the same potential. The coupling wire CL is coupled to, through through-holes at predetermined intervals, an underneath coupling wire CLs positioned underneath the coupling wire CL. The coupling wire CL is provided in the same layer and formed of the same material as the pixel electrodes PE. The underneath coupling wire CLs is provided in the same layer and formed of the same material as the signal lines SL. The reference potentials are, for example, signals having the same potential as the common potential applied to the detection electrodes DE at display. In other words, the second shield layer CES2 is supplied with the same potential as the first shield layer CES1. Accordingly, the first shield layer CES1 and the second shield layer CES2 can shield an electric field generated due to operation of the signal-line coupling circuit 30. The first shield layer CES1 and the second shield layer CES2 can also shield an electric field generated due to pixel signals supplied to the signal lines SL and the wires 53.

FIG. 8 illustrates only part of the shield layer CES for simplification of the drawing, but in reality, the first shield layer CES1 is provided in a direction in which the signal-line coupling circuit 30 extends, and the shield parts 55 of the second shield layer CES2 are arrayed from one end side to the other end side in a direction in which the first shield layer CES1 extends. Detailed configurations of the first shield layer CES1 and the second shield layer CES2 will be described later.

The distance between the gate driver circuit 18 and the wiring region LA increases toward one side in the second direction Dy. The two ion trapping electrodes ITL1 and ITL2 are provided between the gate driver circuit 18 and the wiring region LA. Accordingly, the ion trapping electrodes ITL1 and ITL2 are disposed alongside and do not overlap the first shield layer CES1 and the second shield layer CES2 in the first direction Dx in a plan view.

The ion trapping electrode ITL1 is routed alongside the coupling wire CL without contacting. The ion trapping electrode ITL1 is provided in a curved-line-shaped along the gate driver circuit 18. The ion trapping electrode ITL2 is disposed on the display region DA side of the ion trapping electrode ITL1, more specifically, extends along the wiring region LA between the ion trapping electrode ITL1 and the wiring region LA. One end side of the ion trapping electrode ITL2 bifurcates from the ion trapping electrode ITL1 at a part where the distance between the gate driver circuit 18 and the wiring region LA decreases. One end of the ion trapping electrode ITL2 bifurcates from halfway through the ion trapping electrode ITL1 via a bifurcating electrode ITL3. The other end side of the ion trapping electrode ITL2 is disposed apart from the ion trapping electrode ITL1. However, the ion trapping electrode ITL2 is coupled to the ion trapping electrode ITL1 through the bifurcating electrode ITL3 and formed of one continuous translucent conductive material.

The gate driver circuit 18 curves along an outer periphery 10*s* and the curved line part DAc of the first insulation substrate. A scanning signal wiring region 18L is formed between the gate driver circuit 18 and the outer periphery 10*s*. A plurality of scanning signal wires for supplying gate signals (scanning signals) are provided along the outer periphery 10*s* in the scanning signal wiring region 18L.

A third shield layer CES3 includes a curved part covering the gate driver circuit 18, and a part extending in the first direction Dx and covering the wiring region LA (refer to FIG. 5) between the display region DA and the terminals T1. The third shield layer CES3 is electrically coupled to the first shield layer CES1 and supplied with a reference potential having the same potential as the first shield layer CES1. Accordingly, the third shield layer CES3 can shield an electric field generated in the wiring region LA near the gate driver circuit 18 and the terminals T1.

As described above, in the display device 1, the wiring region TA (signal lines SL), the signal-line coupling circuit 30, the wiring region LA (wires 53), the ion trapping electrodes ITL2 and ITL1, and the gate driver circuit 18 are disposed in the stated order from the boundary BL of the curved line part DAc toward the outer periphery 10*s* of the first insulation substrate. In other words, the shield layer CES (the first shield layer CES1 and the second shield layer CES2), the ion trapping electrodes ITL2 and ITL1, and the third shield layer CES3 are disposed in the stated order from the boundary BL of the curved line part DAc toward the outer periphery 10*s* of the first insulation substrate.

In this manner, a region in which the distance between the gate driver circuit 18 and the boundary BL in the first direction Dx increases is formed near each curved line part DAc in the display device 1. An electric field due to the signal-line coupling circuit 30, the wiring region TA (signal lines SL), and the wiring region LA (wires 53) can be shielded near the curved line part DAc since the first shield layer CES1 and the second shield layer CES2 are provided. Near the curved line part DAc, the distance between the first ion trapping electrode ITL1 and the second ion trapping electrode ITL2 increases as the distance between the gate driver circuit 18 and the shield layer CES increases. Since, in a plan view, the ion trapping electrodes ITL1 and ITL2 are sandwiched between the shield layer CES (the first shield layer CES1 and the second shield layer CES2) and the third shield layer CES3 covering the gate driver circuit 18, ionic impurities can be kept in the peripheral region BE (second region) outside the display region DA (first region).

Figure 9:
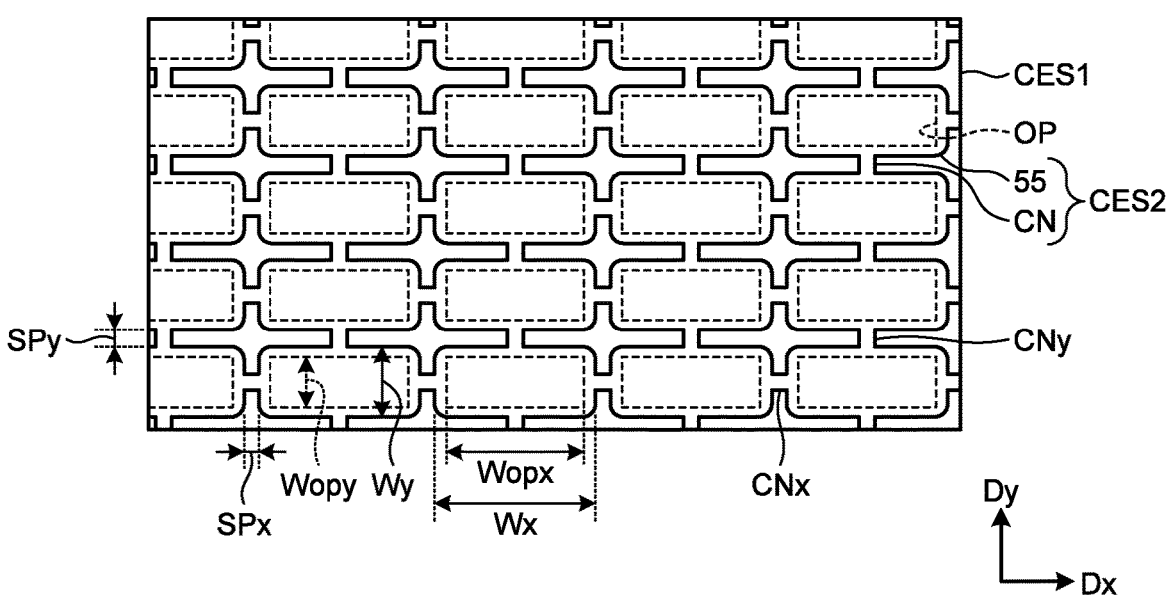
FIG. 9 is a plan view illustrating a first shield layer and a second shield layer in an enlarged manner.

FIG. 9 is a plan view illustrating the first shield layer and the second shield layer in an enlarged manner. As illustrated in FIG. 9, the first shield layer CES1 is provided with a plurality of openings OP. The openings OP have a rectangular shape and are arrayed in a matrix with a row-column configuration. The second shield layer CES2 includes the shield parts 55 and a plurality of coupling parts CN (coupling parts CNx and coupling parts CNy). The shield parts 55 are arrayed in a matrix with a row-column configuration and cover the respective openings OP.

Specifically, in the second shield layer CES2, the shield parts 55 are arrayed at intervals SPx in the first direction Dx, and the shield parts 55 adjacent to each other in the first direction Dx are coupled to each other through a coupling part CNx having a small width. The shield parts 55 are also arrayed at intervals SPy in the second direction Dy, and the shield parts 55 adjacent to each other in the second direction Dy are coupled to each other through a coupling part CNy having a small width. Accordingly, the shield parts 55 arrayed in the first direction Dx and the second direction Dy are electrically coupled to each other. Each shield part 55 is provided over the entire region of the corresponding opening OP.

The width of each opening OP in the first direction Dx is referred to as a first opening width Wopx, and the width of each opening OP in the second direction Dy is referred to as a second opening width Wopy. The first opening width Wopx of each opening OP is larger than the second opening width Wopy.

The width of each shield part 55 of the second shield layer CES2 in the first direction Dx is referred to as a first width Wx, and the width of each shield part 55 in the second direction Dy is referred to as a second width Wy. The first width Wx of each shield part 55 is larger than the second width Wy. The area of each shield part 55 in a plan view is larger than the area of the corresponding opening OP. In other words, the first width Wx of the shield part 55 is larger than the first opening width Wopx of the opening OP, and the second width Wy of the shield part 55 is larger than the second opening width Wopy of the opening OP.

The disposition pitch of the shield parts 55 is equal to the disposition pitch of the openings OP. The disposition pitch of the shield parts 55 is also equal to the disposition pitch of the pixels PX. Alternatively, the disposition pitch of the shield parts 55 may be n or l/n (n is an integer) times larger than the disposition pitch of the pixels PX.

The first shield layer CES1 and the second shield layer CES2 are electrically coupled to each other at an optional place. In the present embodiment, the shield parts 55 are coupled to each other through the coupling parts CNx and CNy. Thus, the first shield layer CES1 and the second shield layer CES2 only need to be electrically coupled to each other at least one place, and no coupling structure such as a contact hole needs to be formed for each shield part 55.

The shapes of the openings OP and the second shield layer CES2 (shield parts 55) illustrated in FIG. 9 are merely exemplary and may be modified as appropriate. The openings OP and the shield parts 55 may have, for example, a square shape, a polygonal shape, a parallelogram shape, a circular shape, an elliptical shape, or an odd shape provided with a cutout or the like. Moreover, the shapes of the openings OP may be different from the shapes of the shield parts 55.

Figure 10:
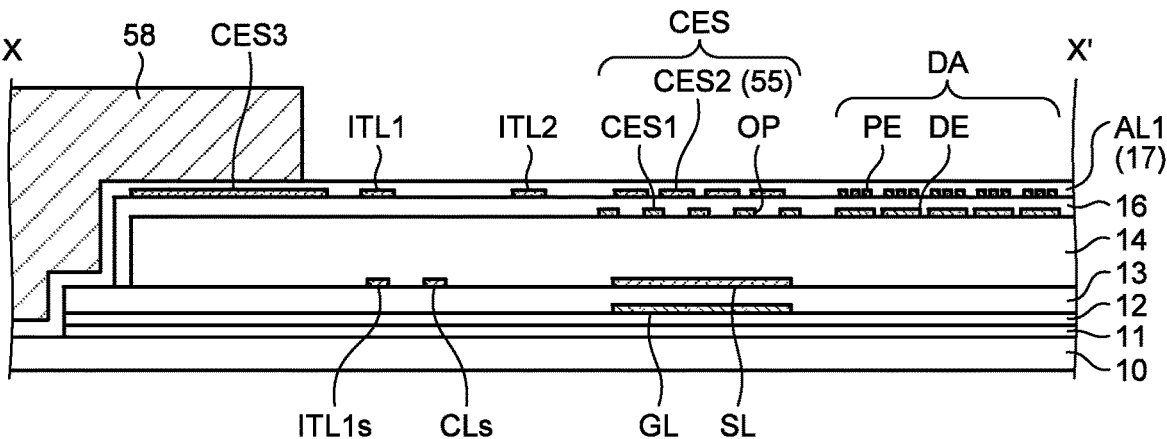
FIG. 10 is an X-X' sectional view of FIG. 8.

FIG. 10 is an X-X' sectional view of FIG. 8. FIG. 10 schematically illustrates a multilayered structure of the signal lines SL and the scan lines GL but omits illustrations of transistors and the like included in the signal-line coupling circuit 30 and the gate driver circuit 18.

As illustrated in FIG. 10, the first shield layer CES1 is provided in the same layer and formed of the same material as the detection electrodes DE. The second shield layer CES2 (the shield parts 55 and the coupling parts CN) is provided in the same layer and formed of the same material as the pixel electrodes PE. The sixth insulating film 16 is provided between the first shield layer CES1 and the second shield layer CES2 in the direction perpendicular to the first insulation substrate 10. In addition, the ion trapping electrodes ITL1 and ITL2, the bifurcating electrode ITL3, and the third shield layer CES3 are provided in the same layer and formed of the same material as the second shield layer CES2 and the pixel electrodes PE. Accordingly, the first shield layer CES1, the second shield layer CES2, the ion trapping electrodes ITL1 and ITL2, and the third shield layer CES3 are formed of a translucent conductive material such as ITO.

An insulating film 17 is provided over the second shield layer CES2, the ion trapping electrodes ITL1 and ITL2, and the third shield layer CES3. The insulating film 17 is formed as the first alignment film AL1 in the display region DA. A sealing part 58 is provided at a peripheral part of the first insulation substrate 10 and overlaps part of the third shield layer CES3.

An underneath coupling wire ITL1s is routed alongside the ion trapping electrode ITL1 on the third insulating film 13 underneath the ion trapping electrode ITL1. The underneath coupling wire CLs is routed on the third insulating film 13 between the ion trapping electrodes ITL1 and ITL2. The same reference potential as the common potential applied to the detection electrodes DE at display is applied to the underneath coupling wire CLs.

The first shield layer CES1 and the second shield layer CES2 are provided over the signal lines SL, which are coupled to the signal-line coupling circuit 30, and the scan lines GL, which are coupled the gate driver circuits 18. The first shield layer CES1 is provided with the openings OP, and the second shield layer CES2 is provided above the openings OP with the sixth insulating film 16 interposed therebetween.

Accordingly, with the configuration in which the first shield layer CES1 is provided with the openings OP, as well, the first shield layer CES1 and the second shield layer CES2 can effectively shield an electric field generated at the signal-line coupling circuit 30 and various wires.

Water potentially enters the fourth insulating film 14, which is made of an organic material, from the outside (for example, the outer periphery side of the first insulation substrate 10). Since the first shield layer CES1 is provided with the openings OP, water having entered the fourth insulating film 14 is released to the outside through the openings OP. Moreover, since the shield parts 55 of the second shield layer CES2 are arrayed at the intervals SPx and SPy, water having passed through the openings OP is released to the outside through the intervals SPx and SPy.

Accordingly, the openings OP and the intervals SPx and SPy form a path through which water having entered the fourth insulating film 14 passes, and thus water can be excellently released to the outside through the first shield layer CES1 and the second shield layer CES2. As a result, water can be prevented from accumulating between the layers of the first shield layer CES1, the second shield layer CES2, and each insulating film. Accordingly, the display device 1 can prevent film peeling of the first shield layer CES1 and the second shield layer CES2 due to water in the fourth insulating film 14.

Figure 11:
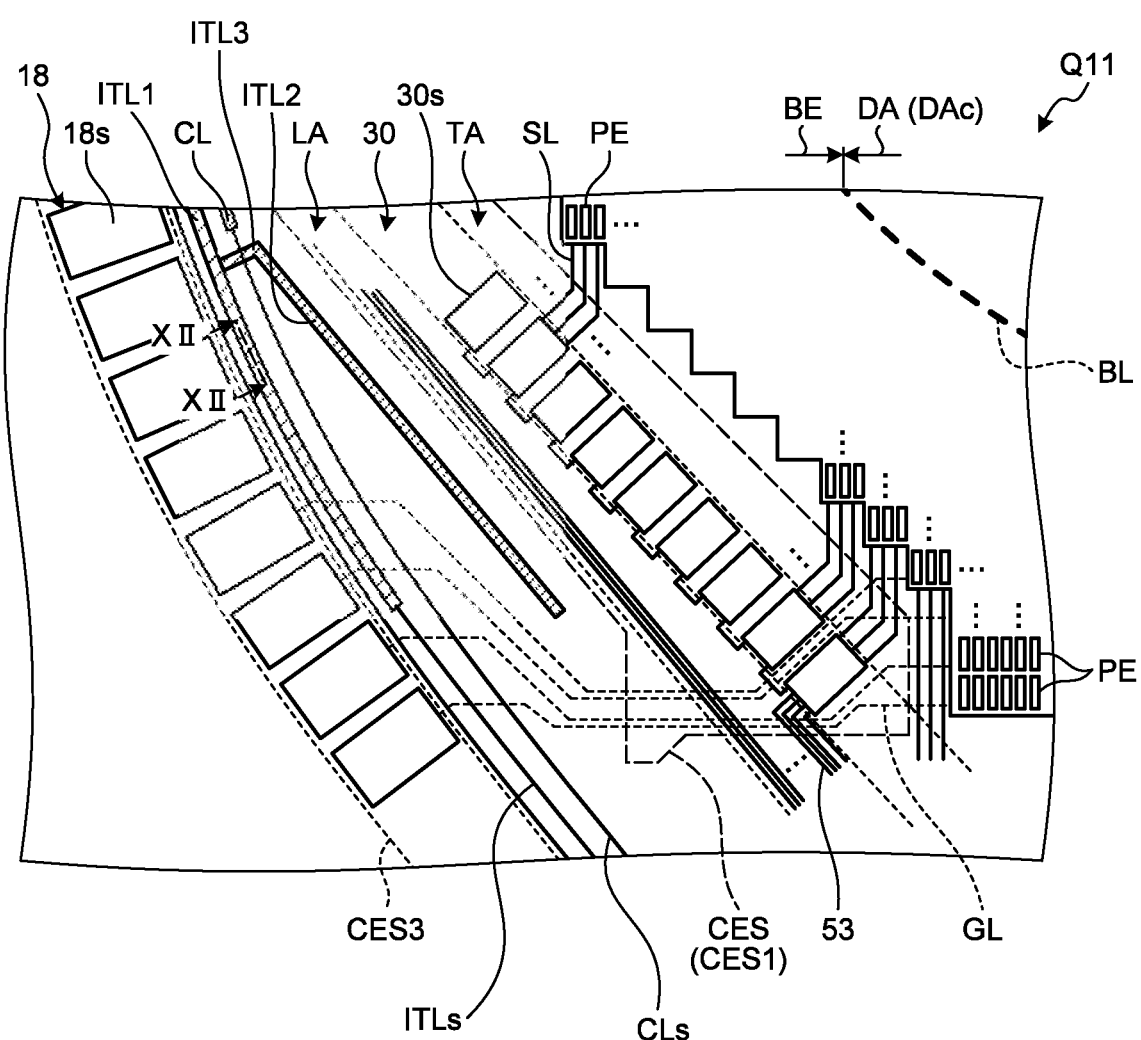
FIG. 11 is a partially enlarged view of a part Q11 in FIG. 8.

FIG. 11 is a partially enlarged view of a part Q11 in FIG. 8. For simplification of the drawing, FIG. 11 illustrates the outer shape of the first shield layer CES1 with dashed and double-dotted lines and omits illustrations of the openings OP and the second shield layer CES2.

As illustrated in FIG. 11, the signal-line coupling circuit 30 includes a plurality of switching circuit parts 30S. The switching circuit parts 30S are provided in accordance with the respective pixels PX arrayed in the first direction Dx and are arrayed along each curved line part DAc. The switching circuit parts 30S are constituted by a plurality of transistors. The switching circuit parts 30S may be disposed at tilt angles different from one another. In addition, the switching circuit parts 30S may be disposed at intervals different from one another.

The width of a region occupied by the wiring region LA, the signal-line coupling circuit 30, and the wiring region TA in the first direction Dx decreases as the distance between the gate driver circuit 18 and the boundary BL of the curved line part DAc decreases. The shapes and disposition orientations of the switching circuit parts 30S at an end part side of the signal-line coupling circuit 30 may differ in accordance with this configuration.

For example, a switching circuit part 30S at an end of the curved line part DAc (at a position farthest from the terminals T1 (refer to FIG. 5)) may have an orientation different from those of the other switching circuit parts 30S and may be disposed such that the long side direction thereof aligns with the second direction Dy. Accordingly, the size of the curved line part DAc can be reduced.

Each gate driver circuit 18 includes a plurality of forwarding circuits 18S. The forwarding circuits 18S are disposed in a curved shape as a whole along the outer periphery 10s of the first insulation substrate 10. The forwarding circuits 18S are disposed at tilt angles different from one another. In addition, the forwarding circuits 18S may be disposed at intervals different from one another.

The scan lines GL coupled to the respective forwarding circuits 18S extend in the second direction Dy and intersect the ion trapping electrodes ITL1 and ITL2. In addition, the scan lines GL intersect the wiring region LA (wires 53), pass through gaps between the adjacent switching circuit parts 30S, intersect the wiring region TA (signal lines SL), and are coupled to the pixels PX.

Figure 12:
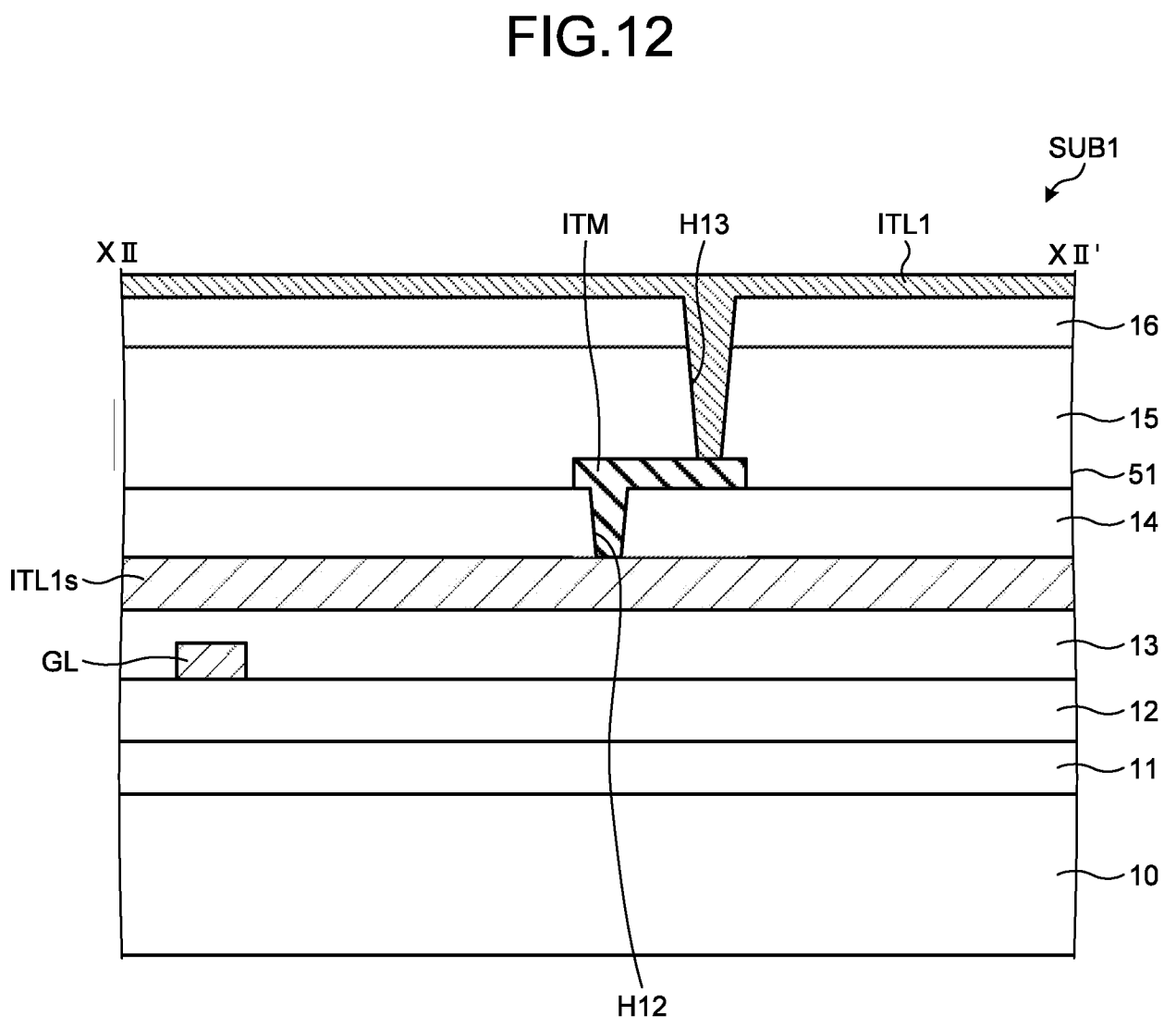

FIG. 12 is a XII-XII' sectional view of FIG. 11. The underneath coupling wire ITL1s is provided on the third insulating film 13. The underneath coupling wire ITL1s is a conductive layer that supplies the VGL potential. The underneath coupling wire ITL1s is provided in the same layer and formed of the same material as the signal lines SL.

The underneath coupling wire ITL1s is covered by the fourth insulating film 14.

A relay conductive layer ITM is provided on the fourth insulating film 14. The relay conductive layer ITM is provided in the same layer and formed of the same material as the relay electrode 65 and sensor wires TL illustrated in FIG. 6.

In this manner, the underneath coupling wire ITL1s is coupled to the ion trapping electrode ITL1 through contact holes H13 at predetermined intervals. The underneath coupling wire ITL1s is, for example, a metal wire provided in the same layer as the signal lines SL. The VGL potential is provided to the ion trapping electrodes ITL1 and ITL2 through the underneath coupling wire ITL1s.

In this manner, the first shield layer CES1 and the second shield layer CES2 overlap a region in which the wiring region LA (wires 53), the switching circuit parts 30S, the wiring region TA (signal lines SL), and the scan lines GL are provided. Accordingly, the first shield layer CES1 and the second shield layer CES2 can effectively shield an electric field near the curved line part DAc.

Figure 13:
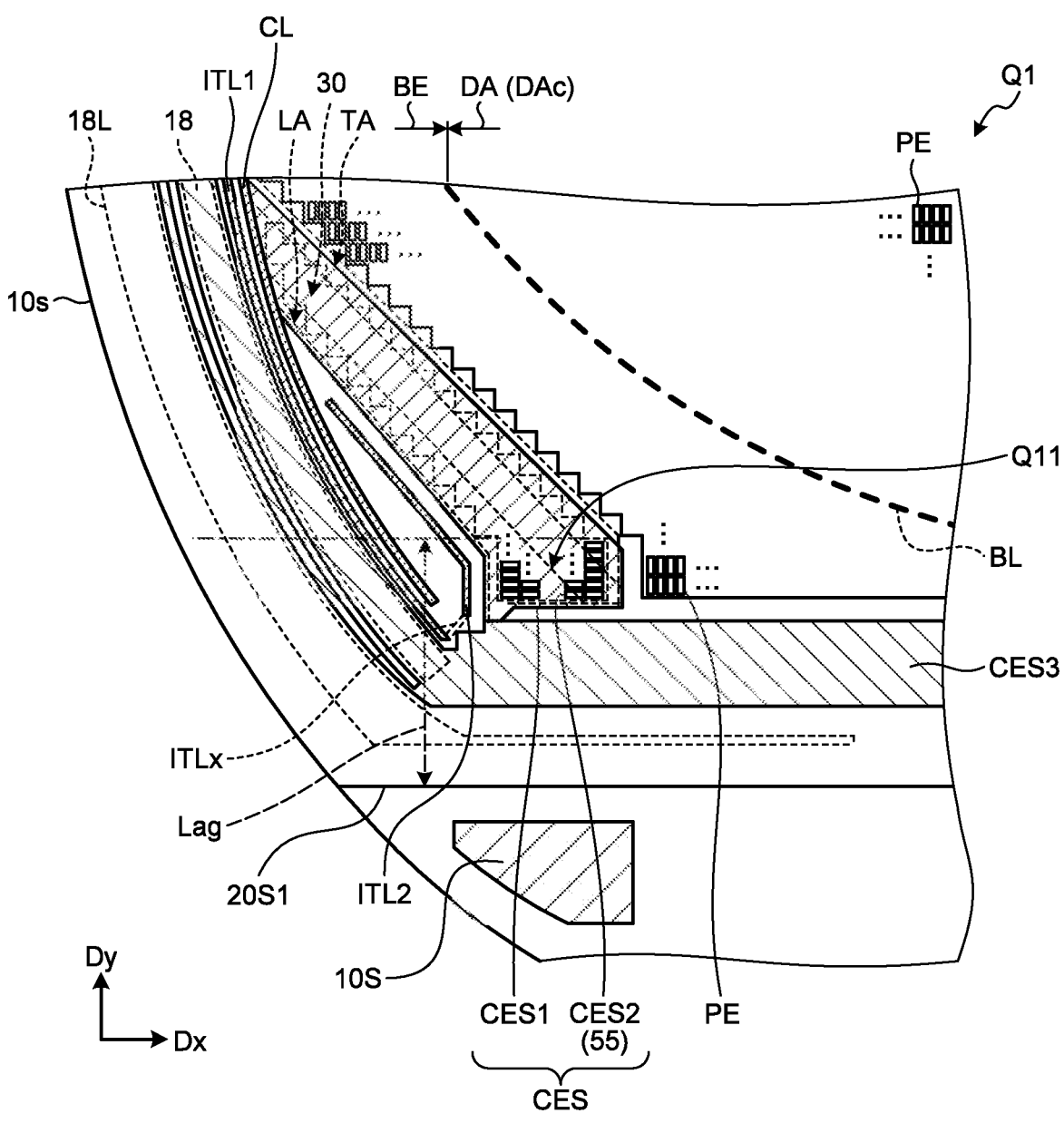
FIG. 13 is a plan view illustrating a shield layer and an ion trapping electrode according to a comparative example disposed adjacent to the display region at a curved-line-shaped corner part.

FIG. 13 is a plan view illustrating a shield layer and an ion trapping electrode according to a comparative example disposed adjacent to the display region at a curved-line-shaped corner part. As illustrated in FIG. 13, the ion trapping electrodes ITL1 and ITL2 according to the comparative example are each formed in a U shape bent at a coupling part ITLx. The coupling part ITLx is close to the pad electrode 10S, and thus part of the ion trapping electrodes ITL1 and ITL2 is positioned in the range of a certain distance Lag from the first side 20s1 of the second insulation substrate 20.

For example, in a case in which salt water is accumulated on the protrusion part 10A for a long time in a severe environment, the salt water reacts with silver of the conductive pillar 10P illustrated in FIG. 2B and a compound attributable to the component of the silver paste potentially deposits in the range of the certain distance Lag. The range of the certain distance Lag is, for example, 1.4 mm. The deposit often has conductivity and unintended current flows between the third shield layer CES3 and the ion trapping electrode ITL1 having different potentials and between the shield layer CES (the first shield layer CES1 and the second shield layer CES2) and the ion trapping electrode ITL2 having different potentials, and the flow potentially impairs functions of the gate driver circuit 18 and the signal-line coupling circuit 30.

However, the display device 1 according to the embodiment includes the ion trapping electrode ITL1, the ion trapping electrode ITL2, and the bifurcating electrode ITL3. The ion trapping electrode ITL1 is disposed between the shield layer CES and the gate driver circuit 18, provided in a linear shape along the gate driver circuit 18, and supplied with constant potential. The second ion trapping electrode ITL2 is disposed between the shield layer CES and the first ion trapping electrode ITL1 and provided in a linear shape along an edge of the shield layer CES. The second ion trapping electrode ITL2 is supplied with the same potential as the ion trapping electrode ITL1. The bifurcating electrode ITL3 is a bifurcating part through which the second ion trapping electrode ITL2 in the linear shape bifurcates from halfway through the first ion trapping electrode ITL1 in the linear shape. Accordingly, the first ion trapping electrode ITL1 and the second ion trapping electrode ITL2 do not necessarily need to be coupled to each other in a U shape. As illustrated in FIG. 8, part of the ion trapping electrodes ITL1 and ITL2 can be kept out of the range of the certain distance Lag from the first side 20s1 of the second insulation substrate 20.

The other end of the ion trapping electrode ITL1 and the other end of the ion trapping electrode ITL2 are positioned farther than the certain distance Lag from the first side 20s1 of the second insulation substrate 20. When the certain distance Lag is 1.4 mm, the first ion trapping electrode ITL1 and the second ion trapping electrode ITL2 are not provided at the distance of 1.4 mm from the first side 20s1 of the counter substrate SUB2, the first side 20s1 being adjacent to the protrusion part 10A of the array substrate SUB1. Accordingly, in the range in which a compound attributable to the component of the silver paste deposits, unintended current flows neither between the third shield layer CES3 and the ion trapping electrode ITL1 having different potentials nor between the shield layer CES and the ion trapping electrode ITL2 having different potentials. As a result, functions of the gate driver circuit 18 and the signal-line coupling circuit 30 are less likely to be impaired and reliability of the display device 1 improves.

As described above, near the curved line part DAc, the distance between the first ion trapping electrode ITL1 and the second ion trapping electrode ITL2 increases as the distance between the gate driver circuit 18 and the shield layer CES increases. Since the second ion trapping electrode ITL2 is provided along the edge of the shield layer CES and the edge of the shield layer CES is gradually larger than an edge of the third shield layer CES3, the length from the bifurcating electrode ITL3 to the other end of the second ion trapping electrode ITL2 is longer than the length from the bifurcating electrode ITL3 to the other end of the first ion trapping electrode ITL1.

In the pixels of the display device 1, a plurality of detection electrodes DE (first electrodes) and a plurality of pixel electrodes PE (second electrodes) are sequentially layered with an insulating film interposed between layers. Thus, the conductive layer 21 can reduce static electricity applied to the liquid crystal layer LC in a display device using a horizontal electric field formed between each pixel electrode PE and each common electrode (detection electrode DE) provided in the array substrate SUB1. To set the conductive layer 21 to the reference potential, the pad electrode 10S is provided at the protrusion part 10A of the array substrate SUB1 in the display device 1, the protrusion part 10A being exposed from the counter substrate SUB2, and the conductive pillar 10P provided on the pad electrode 10S is electrically coupled to the conductive layer 21.

The coupling wire CL that supplies potential to the shield layer CES does not intersect the second ion trapping electrode ITL2 and the bifurcating electrode ITL3. Accordingly, the coupling wire CL is not short-circuited with the second ion trapping electrode ITL2 and the bifurcating electrode ITL3.

The preferable embodiment of the present disclosure is described above, but the present disclosure is not limited to the embodiment. Contents disclosed in the embodiment are merely exemplary and may be modified in various kinds of manners without departing from the scope of the present disclosure. Any modification performed as appropriate without departing from the scope of the present disclosure naturally belongs to the technical scope of the present disclosure. At least one of various kinds of omission, replacement, and change of constituent components may be performed without departing from the gist of each of the embodiment and any modification described above.

For example, the wiring region LA may include an ion trapping electrode according to JP-A-2021-113960 on the first side sDA1 described above. The above-described embodiment includes an aspect in which the ion trapping electrode according to JP-A-2021-113960 is provided, and accordingly, ion trapping electrodes are disposed on the first side sDA1, the second side sDA2, the third side sDA3, the fourth side sDA4, and the curved line parts DAc.

In the above description, a plane defined by the first direction Dx and the second direction Dy is parallel to the surface of the array substrate SUB1, but the surface of the array substrate SUB1 may be curved. In this case, a first direction is defined to be a predetermined direction with respect to the direction of a view in which the display device 1 has a maximum area, and a second direction is defined to be a direction intersecting the first direction. A third direction orthogonal to the first direction and the second direction may be defined as the direction of a view in which the display device 1 has a maximum area.

What is claimed is:

1. A display device comprising:
an array substrate;
a first region in which a plurality of scan lines extending in a first direction, a plurality of signal lines extending in a second direction, and a plurality of pixels are provided on the array substrate and that has a first side, a second side, a third side, a fourth side, and a plurality of curved line parts;
a second region positioned between an end part of the array substrate and the first region;
a signal-line coupling circuit disposed in the second region and coupled to the signal lines;

a shield layer disposed in the second region and covering at least part of the signal-line coupling circuit near at least one of the curved line parts;
a gate driver circuit disposed in the second region outside the signal-line coupling circuit and coupled to the scan lines;
a first ion trapping electrode disposed between the shield layer and the gate driver circuit, provided in a linear shape along the gate driver circuit, and supplied with constant potential;
a second ion trapping electrode disposed between the shield layer and the first ion trapping electrode, provided in a linear shape along an edge of the shield layer, and supplied with the same potential as the first ion trapping electrode; and
a bifurcating electrode through which the second ion trapping electrode bifurcates from halfway through the first ion trapping electrode in the linear shape.

2. The display device according to claim 1, wherein a distance between the first and the second ion trapping electrodes increases as a distance between the gate driver circuit and the shield layer increases.

3. The display device according to claim 1, wherein
each of the pixels includes a first electrode, an insulating film on the first electrode, and a second electrode on the insulating film,
the display device includes a counter substrate placed over the array substrate,
a conductive layer covers a surface of the counter substrate, the surface being on a side opposite the array substrate,
a pad electrode is provided at a protrusion part of the array substrate, the protrusion part being exposed from the counter substrate, and
a conductive pillar provided on the pad electrode is electrically coupled to the conductive layer.

4. The display device according to claim 3, wherein the first and the second ion trapping electrodes are not provided at a distance of 1.4 mm from a side of the counter substrate, the side being adjacent to the protrusion part of the array substrate.

5. The display device according to claim 1, wherein the shield layer is supplied with potential different from the potential applied to the first and the second ion trapping electrodes.

6. The display device according to claim 1, wherein the first and the second ion trapping electrodes are provided in a same layer as at least part of the shield layer and do not overlap the shield layer in a plan view.

7. The display device according to claim 1, further comprising a coupling wire that supplies potential to the shield layer, wherein the coupling wire intersects neither the second ion trapping electrode nor the bifurcating electrode.

* * * * *